United States Patent
Mueller et al.

(10) Patent No.: US 8,518,783 B2
(45) Date of Patent: Aug. 27, 2013

(54) GATE STRUCTURE FOR FIELD EFFECT TRANSISTOR

(75) Inventors: Markus Mueller, Brussels (BE); Guillaume Boccardi, Leuven (BE); Jasmine Petry, Brussels (BE)

(73) Assignee: NXP B.V., Eindhoven (NL)

( * ) Notice: Subject to any disclaimer, the term of this patent is extended or adjusted under 35 U.S.C. 154(b) by 222 days.

(21) Appl. No.: 12/989,521

(22) PCT Filed: Apr. 27, 2009

(86) PCT No.: PCT/IB2009/051714
§ 371 (c)(1), (2), (4) Date: Oct. 25, 2010

(87) PCT Pub. No.: WO2009/133515
PCT Pub. Date: Nov. 5, 2009

(65) Prior Publication Data
US 2011/0037131 A1 Feb. 17, 2011

(30) Foreign Application Priority Data
May 2, 2008 (EP) .................................. 08103805

(51) Int. Cl.
*H01L 21/336* (2006.01)
(52) U.S. Cl.
USPC .................. 438/287; 438/591; 257/E21.409
(58) Field of Classification Search
USPC ................. 257/410, 411, E21.177, E21.409; 438/287, 514, 585, 591
See application file for complete search history.

(56) References Cited

U.S. PATENT DOCUMENTS

| | | | | |
|---|---|---|---|---|
| 6,703,277 | B1 * | 3/2004 | Paton et al. | 438/287 |
| 7,678,710 | B2 * | 3/2010 | Chua et al. | 438/784 |
| 8,053,306 | B2 * | 11/2011 | Carter et al. | 438/228 |
| 2004/0012043 | A1 | 1/2004 | Gealy et al. | |
| 2006/0157741 | A1 | 7/2006 | Jin | |

FOREIGN PATENT DOCUMENTS

| | | |
|---|---|---|
| EP | 1 271 632 A1 | 1/2003 |
| EP | 1271632 A1 * | 1/2003 |

OTHER PUBLICATIONS

International Search Report and Written Opinion for Application PCT/IB2009/051714 (Apr. 27, 2009).

* cited by examiner

*Primary Examiner* — Tuan N. Quach

(57) ABSTRACT

A field effect transistor having a gate structure that comprises an interfacial layer positioned in between the transistor channel region and a high-K dielectric layer of the gate stack. The interfacial layer comprises $Al_xSi_yO_z$, which has a higher relative dielectric constant value than $SiO_2$. A method of forming the gate structure of a field effect transistor. The method includes forming a gate stack comprising, in order: a $SiO_2$-based layer adjacent a channel region of the field effect transistor; a high-K dielectric layer on the $SiO_2$-based layer; and a gate electrode on the high-K dielectric layer. The method also includes introducing Al into the $SiO_2$-based layer to form an $Al_xSi_yO_z$ interfacial layer in between the high-K dielectric layer and the channel region. A heating step to allows Al introduced into channel region to diffuse out of the channel region into the interfacial layer.

9 Claims, 3 Drawing Sheets

GATE STRUCTURE FOR FIELD EFFECT TRANSISTOR

This application is a 371 of International application PCT/IB2009/051714 filed Apr. 27, 2009, and claiming priority of EP application 08103805.1 filed May 2, 2008.

FIELD OF THE INVENTION

This invention relates to gate structures for field effect transistors. In particular, this invention relates to gate structures that include a high-K dielectric layer and an interfacial layer located in between the high-K dielectric and a channel region of the field effect transistor.

BACKGROUND OF THE INVENTION

The ever decreasing dimensions of semiconductor devices such as field effect transistors continue to present new challenges for gate design and manufacture. As gate lengths reduce, the thickness of the gate insulating layers that are used must also decrease. Conventionally, $SiO_2$ has been used as a gate insulator. However, since $SiO_2$ layers thinner than around 1.0-1.5 nm suffer from unacceptably strong gate leakage effects, attention in recent times has turned to alternative structures that include high-K dielectric materials.

High-K dielectric materials allow thicker insulating layer dimensions to be employed, while retaining relatively high values of gate capacitance.

As illustrated in FIG. 1, known high-K gate structures use a bi-layered arrangement comprising a dielectric layer 4 of high-K gate material and an interfacial layer 2, which is located in between high-K dielectric layer 4 and the channel region 6 of the field effect transistor 10. The purpose of the interfacial layer 2, which typically comprises a layer of relatively low-K $SiO_2$ is to act as a seed for the growth of the high-K dielectric layer 4 (which can be crystalline or amorphous) during manufacture. The gate electrode 8 itself is formed on top of the high-K dielectric layer 4. The gate electrode 8 may typically comprise a metal or polysilicon layer. Spacers 5 are typically provided on either side of the gate.

Present high-K gate technologies are unable to meet the demands of the International Technology Roadmap for Semiconductors (ITRS), which foresees an 8 Å CETinv (Capacitance Equivalent Thickness under inversion) for high performance applications in 2011 (this is equivalent to a standard oxide ($SiO_2$) thickness of 4-5 Å). In present high-K gate structures of the kind shown in FIG. 1, the interfacial layer 2 is typically formed with a thickness of 3-8 Å. Thermal treatments during manufacture cause regrowth of the interfacial layer 2 that can increase its thickness to 7-12 Å. Moreover, the high-K dielectric layer 4 thickness is limited by the fact that known high-K materials cannot at present be grown homogenously below a thickness of around 12-15 Å.

A known approach to enhancing the performance of gate structures of the kind shown in FIG. 1 is to increase the relative dielectric constant value ($\kappa$) of the interfacial layer 2. $SiO_2$ has a relative dielectric constant value of $\kappa=4$, which compares unfavourably with $\kappa$ the values of around 15-25 for known high-K gate dielectrics. By increasing the $\kappa$ value of the interfacial layer 2, the effective overall $\kappa$ value of the gate insulation can be improved. Following this approach, nitridation of the $SiO_2$ has been found to increase the $\kappa$ value of the interfacial layer 2 (since $Si_3N_4$ has a higher $\kappa$ value ($\kappa=7$) than $SiO_2$ ($\kappa=4$)). Moreover, nitridation of the $SiO_2$ has been found to reduce regrowth of the interfacial layer 2 during thermal treatment by 1-2 Å. However, this approach has it drawbacks, since in practice the nitridation process has a detrimental effect on carrier mobility within the channel region 6 of the transistor 10, which lies directly beneath the interfacial layer 2.

It is an object of this invention to address at least some of the limitations noted above in respect of existing gate structures incorporating high-K dielectrics.

SUMMARY OF THE INVENTION

Particular and preferred aspects of the invention are set out in the accompanying independent and dependent claims. Combinations of features from the dependent claims may be combined with features of the independent claims as appropriate and not merely as explicitly set out in the claims.

According to an aspect of the invention, there is provided a field effect transistor. The field effect transistor has a gate structure which comprises, in order: an interfacial layer adjacent a channel region of the field effect transistor, the interfacial layer comprising $Al_xSi_yO_z$; a high-K dielectric layer on the interfacial layer; and a gate electrode on the high-K dielectric layer.

According to another aspect of the invention, there is provided a method of forming a gate structure of a field effect transistor. The method includes forming a gate stack comprising, in order: a $SiO_2$-based layer adjacent a channel region of the field effect transistor; a high-K dielectric layer on the $SiO_2$-based layer; and a gate electrode on the high-K dielectric layer. The method also includes performing an Al (Aluminium) introduction step, whereby Al is introduced into the $SiO_2$-based layer to form an $Al_xSi_yO_z$ interfacial layer in between the high-K dielectric layer and the channel region. The method further includes performing a heating step to allow Al introduced into channel region during said Al introduction step to diffuse out of the channel region into the interfacial layer.

The $Al_xSi_yO_z$ interfacial layer in between the high-K dielectric layer and the channel region has a higher relative dielectric constant value than conventional $SiO_2$ interfacial layers in known high-K gate structures. It may be anticipated that the overall $\kappa$ value of the interfacial layer comprising $Al_xSi_yO_z$ will lie somewhere in between the $\kappa$ value of $SiO_2$ ($\kappa=4$) and $Al_2O_3$ ($\kappa=8$) depending upon the stoichiometry. Moreover, it has been found that the addition of Al has no adverse affects in terms of mobility within the channel region. In particular, the heating step allows Al introduced into the device to diffuse out of the channel region and back into the interfacial layer.

In accordance with the invention, at least some Al is present within the interfacial layer between the high-K dielectric layer and the channel region (i.e. the interfacial layer comprises $Al_xSi_yO_z$, where x>0, y>0 and z>0). The increased concentration of Al associated with larger values of x lead to increased values of $\kappa$ for the interfacial layer, as noted above. Nevertheless, and as discussed herein below, relatively small concentrations have been found to have a beneficial effect on the $\kappa$ value of the interfacial layer.

The addition of Al into the gate electrode (which may, for example, comprise a metal or poly-silicon layer) has been found to produce a p-type tuning effect on the work function of the gate electrode. This tuning effect may itself be used to tailor the characteristics of the gate. However, if p-type tuning is not desired, then n-type dopants can be added to the gate electrode or an n-type metal gate can be used to compensate.

In one embodiment, the interfacial layer has a thickness in the range 3 to 12 Å.

In one embodiment, the high-K dielectric layer has a thickness in the range 1-3 nm.

In one embodiment, the high-K dielectric layer has a value of κ greater than 15. In particular, the high-K dielectric layer can have a value of κ in the range 15-25.

The high-K dielectric layer can comprise a material selected from the group of materials consisting of $HfO_2$, $ZrO_2$, $TiO_2$, $Ta_2O_5$, HfSiO, $La_2O_3$, $Y_2O_3$ and $Al_2O_3$.

The field effect transistor can comprise, for example, a Metal Insulator Semiconductor Field Effect Transistor (MISFET), a Fin Field Effect Transistor (FinFET), or a Trench Field Effect Transistor (TrenchFET).

In accordance with an embodiment of the invention, Al can be introduced into the device using ion beam implantation techniques. An implantation energy in the range 2-8 keV and a dosage level in the range $1\times10^{15}$ cm$^{-2}$ to $6\times10^{15}$ cm$^{-2}$ can be used, depending on the layer thicknesses and material densities of the gate electrode (typically 2-15 nm thick) and any cap layer that is provided (typically 5-10 nm thick) on the gate electrode. Alternative techniques to ion beam implantation (such as plasma doping (PLAD)) may also be used to introduce Al into the device.

BRIEF DESCRIPTION OF THE DRAWINGS

Embodiments of the present invention will be described hereinafter, by way of example only, with reference to the accompanying drawings in which like reference signs relate to like elements and in which.

DETAILED DESCRIPTION

Embodiments of the present invention are described in the following with reference to the accompanying drawings.

Embodiments of this invention can provide a field effect transistor having a novel high-K gate structure, in which the interfacial layer has an enhanced κ value. In particular, in accordance with this invention, it has been found that by introducing Al into a $SiO_2$-based interfacial layer, the κ value of the interfacial layer can be increased, thereby increasing the overall effective κ value of the gate insulation. In the following, the invention is described with reference to the gate structure of a bulk MISFET. However, it will be appreciated that the described embodiments are merely examples of how the invention may be implemented to enhance the effective κ value of the gate insulation of a high-K gate structure in a field effect transistor. In particular, it will be appreciated that a gate structure of the kind described herein may be provided for field effect transistors other than bulk MISFETs. For example, the invention may be applied to other forms of field effect transistor such as FinFETs and TrenchFETs.

Figure 1:
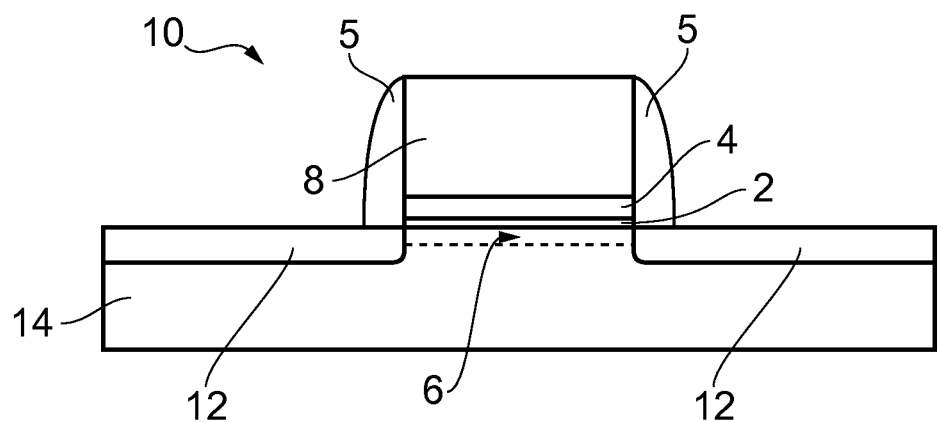
FIG. 1 shows an example of a known field effect transistor incorporating a high-K gate structure.
Figure 2:
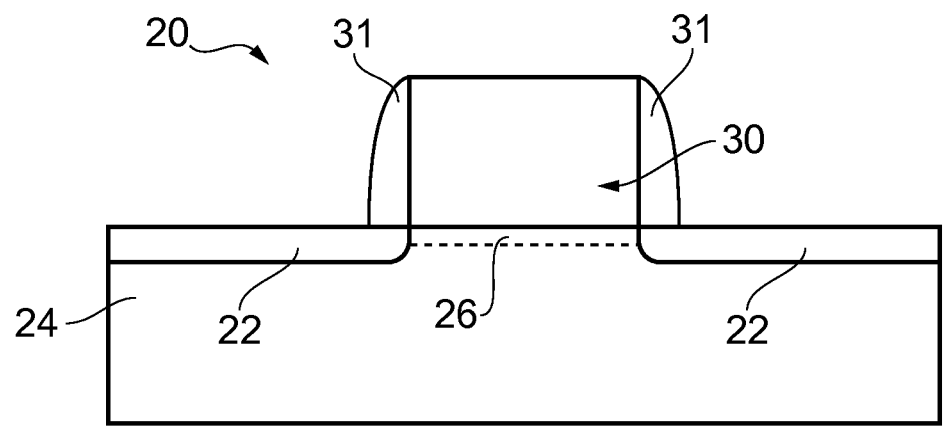
FIG. 2 shows an example of a field effect transistor in accordance with an embodiment of the invention.

An example of a field effect transistor incorporating a gate structure in accordance with an embodiment of this invention is illustrated schematically in FIG. 2. In this example, the field effect transistor 20 comprises a bulk MISFET such a MOSFET. The field effect transistor 20 includes source/drain regions 22 which are provided at the surface of a semiconductor substrate 24. Extending between the source/drain regions 22, there is a channel region 26 as is well known in conventional bulk MOSFET arrangements. Above the channel region 26, there is provided a gate structure 30. The gate structure 30 can be provided with spacers 31 on either side. As with conventional bulk MOSFETs, a potential applied above the channel region 26 through the gate structure 30 is used to control conduction between the source/drain regions 22 through the channel region 26.

Figure 3:
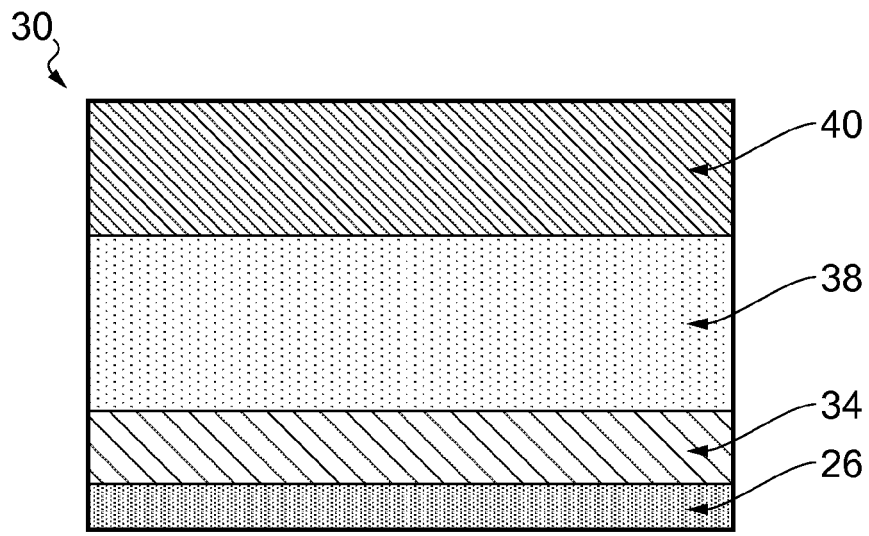
FIG. 3 shows an example of a gate structure for a field effect transistor in accordance with an embodiment of the invention.

FIG. 3 shows the gate structure 30 of the field effect transistor 20 in more detail. As can be seen in FIG. 3, the gate structure 30 is provided above the channel region 26 of the MOSFET. The gate structure 30 in this example includes an interfacial layer 34 formed on the surface of the semiconductor substrate 24 (see FIG. 2).

On an upper surface of the interfacial layer 34 there is provided a high-K dielectric layer 38. The purpose of the interfacial layer 34 is to act as a seed layer for the high-K dielectric layer 38. In accordance with an embodiment of the invention, the κ value of the material used in the high-K dielectric layer 34 is greater than 15. Examples of materials that may be used to form the high-K dielectric layer 38 include $HfO_2$, $ZrO_2$, $TiO_2$, $Ta_2O_5$, HfSiO, $La_2O_3$, $Y_2O_3$ and $Al_2O_3$. The high-K dielectric layer can, in some embodiments, comprise a stack of sub-layers, each comprising one or more of the high-K materials indicated above.

As described below, the interfacial layer 34 itself comprises $Al_xSi_yO_z$. In accordance with this invention, it has been found that by providing an interfacial layer 34 having this composition, the κ value of the interfacial layer 34 is enhanced relative to known $SiO_2$ interfacial layers. As mentioned above, this increases the overall effective κ value of the insulation provided in the gate structure (i.e. the effective κ value of the interfacial layer 34 combined with the high-K dielectric layer 38). In accordance with an embodiment of the invention, the thickness of the interfacial layer 34 can be in the range 3 to 12 Å. The thickness of the high-K dielectric layer can be in the range 1 to 3 nm.

As shown in FIG. 3, above the gate insulation of the gate structure 30 (which consists of the interfacial layer 34 and the high-K dielectric layer 38), there is provided a gate electrode 40. Any suitable conventional material may be used for the purposes of the gate electrode 40. By way of example, the gate electrode may comprise polysilicon. Alternatively, the gate electrode 38 can comprise metals or metal compounds such as Mo, Ru, MoO, W, TiN, TaN, WN, MoN, TaC, TaCN, TaCNO, TaSi, HfSi, NiSi, with variable stoichiometries for each compound. Where the gate electrode 40 comprises a pure metal there can also be provided a Si cap layer.

An example method of making a gate structure of the kind described above with respect to FIGS. 2 and 3 will now be described in relation to FIGS. 5A to 5C.

Figure 5A:
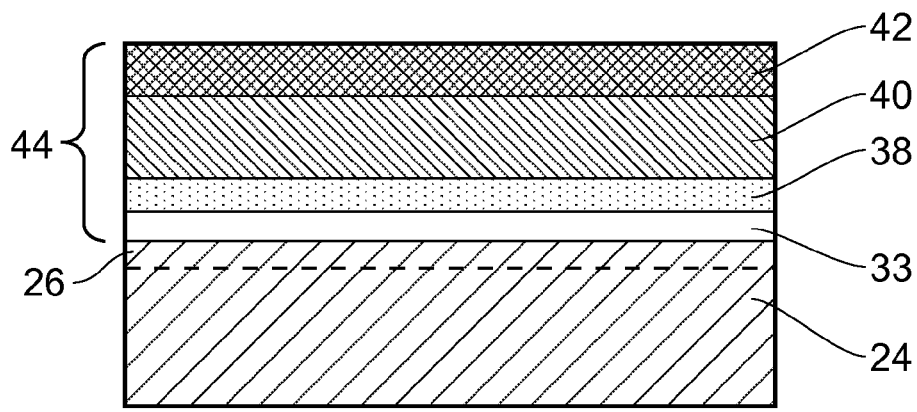
FIGS. 5A to 5C show various stages in an example method for manufacturing a gate stack for a field effect transistor in accordance with an embodiment of the invention.

As is shown in FIG. 5A, the first stage in manufacturing a gate structure in accordance with this example comprises forming a gate stack 44 on the surface of a semiconductor substrate 24. The relative order of the steps for manufacturing the remaining features of the field effect transistor is not essential to this invention. In particular, the source/drain regions of the field effect transistor may either be formed prior to or subsequent to the formation of the gate stack, in accordance with the design requirements of the processing required.

The gate stack 44 itself includes a number of layers as shown in FIG. 5A. On the surface of the semiconductor substrate 24, above the channel region 26 of the field effect transistor, there is provided a $SiO_2$-based layer 33. This layer may be formed in a number of ways. Typically, the layer 33 may be formed by oxidising (e.g. using a thermal or chemical oxidisation step) the surface of a silicon semiconductor substrate 24. Above the $SiO_2$ layer 33 there is provided a high-K dielectric layer 38 of the kind described above. The high-K dielectric layer 38 can be formed above the layer 33 by depositing a high-K dielectric material in a conventional manner (e.g. by Atomic Layer Deposition (ALD), Metal-Organic Chemical Vapour Deposition (MOCVD) or Physical Vapour Deposition (PVD)). Similarly, conventional techniques (e.g. ALD, CVD, MOCVD or PVD) can be used to provide the gate electrode material 40 above the high-K dielectric layer 38 and the optional capping layer 42 above the gate electrode material 40. Conventional techniques (such as masking and etching steps) can be employed to pattern the gate stack 44. Typical thicknesses for the layers in the gate stack 44 are as follows:

$SiO_2$ interfacial layer 33=3-8 Å;
high-K dielectric layer 38=2-3 nm;
gate electrode material 40=2-15 nm;
capping layer 42=5-10 nm.

Figure 5B:
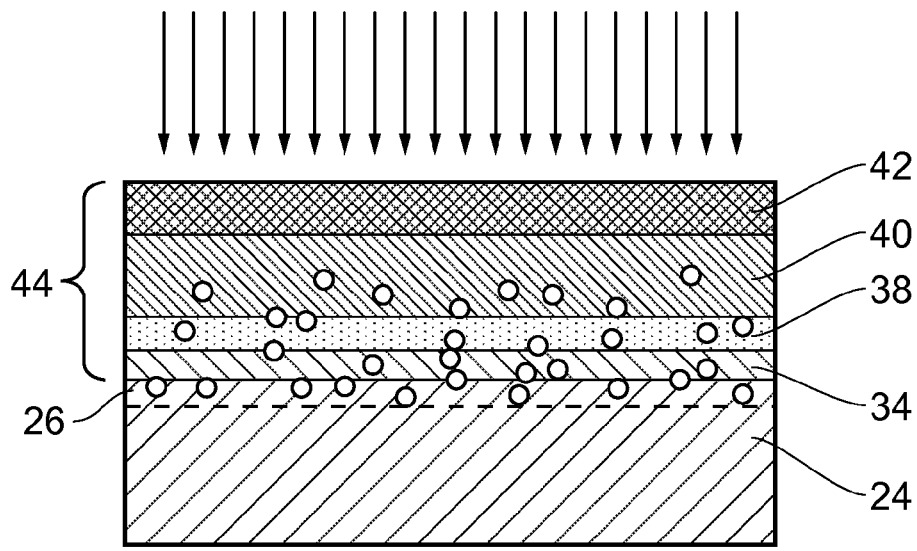

The next stage in the method of making the new gate structure in accordance with this invention is shown FIG. 5B. After formation of the gate stack 44 as described above, Al is introduced into the $SiO_2$-based layer 33. Upon the introduction of the Al into the $SiO_2$-based layer an interfacial layer 34 is formed, which comprises $Al_xSi_yO_z$, where x>0 (i.e. at least some Al is present within the interfacial layer 34).

Any suitable method for introducing the Al into the layer 33 can be used. In the present example, and as show in FIG. 5B, an ion implantation step is used. In accordance with this example, a beam of Al ions is directed down through an upper surface of the gate stack 44 with sufficient energy to reach the layer 33, whereby an interfacial layer 34 including at least some Al ions is formed. Typical implantation energies that may be used to implant the Al ions lie within the range 2 to 8 keV. The dosage level for the ion implantation step can lie in the range $1 \times 10^{15}$ $cm^2$ to $6 \times 10^{15}$ $cm^{-2}$. As an alternative method for introducing Al into the layer 33, a plasma doping (PLAD) step may be used.

As illustrated in FIG. 5B, the introduction of Al into the layer 33 to form the interfacial layer 34 typically also includes the introduction of Al into other parts of the field effect transistor. For example, and as shown in FIG. 5B, introduction of Al into the layer 33 may also cause introduction of Al into the gate electrode layer 40, the high-K dielectric layer 38 and, in particular, the channel region 26 in the semiconductor substrate 24. The introduction of impurities of this kind into the channel region 26 of a field effect transistor typically has undesirable effects. For example, as described above in relation to the nitridation of interfacial layers known in the prior art, the introduction of N into the channel region of a field effect transistor can have a detrimental effect on the mobility of charge carries within the channel region.

Figure 5C:
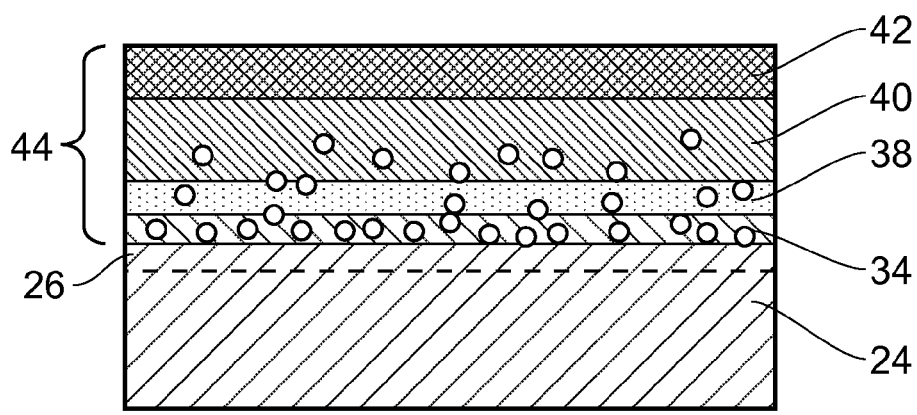

The next stage of the manufacturing process in accordance with an embodiment of the invention is illustrated in FIG. 5C. Following the introduction of Al into the layer 33 to form the interfacial layer 34, a heating step is performed. In this step, at least the channel region 26 of the field effect transistor is heated (but in practice typically the whole of the field effect transistor is heated along with the channel region 26) to cause Al that has been introduced into the channel region 26 during the Al introduction step described in relation to FIG. 5B above, to diffuse out of the channel region 26 and into the interfacial layer 34.

The low solubility of Al in materials that are typically used to form semiconductor substrates for devices of this kind (in particular, Si) means that the performance of a heating step will remove a substantial part of the Al from the channel region 26 of the field effect transistor. This has a number of beneficial effects. The main effect is that impurities are removed from the channel region 26, whereby any potential detrimental effect of the Al introduction step described above on the charge carrier mobility within channel region 26 is minimised. Moreover, the Al which diffuses from the channel region 26 back into the interfacial layer 34 will enhance the Al content of the interfacial layer 34, which in turn will increase the κ value of the interfacial layer 34 as described above.

The heating step itself can comprise parameters which fall within standard CMOS annealing conditions. By way of an example, the heating step can comprise heating the field effect transistor to a temperature in the range 600-1100° C. for a duration of between 1 s (for highest temperatures) to several minutes (for lowest anneal temperatures).

As shown in FIG. 5C, following the heating step, the channel region 26 of the field effect transistor is substantially free from Al ions. It should be noted that the heating step may also cause Al introduced into other parts of the gate stack (and in particular, the high-K dielectric layer 38 and gate electrode material 40 to diffuse into the interfacial layer 34). This would further enhance the Al content of the interfacial layer 34, again increasing its κ value.

An effect of the introduction of Al into the gate stack 44 described in relation to FIG. 5 above, is that p-type tuning of the gate electrode material 40 can occur. This effect may actually prove to be useful for tuning the work function of the gate electrode. However, if tuning of this kind is not desired, then n-type dopants can be added to the gate electrode layer 40 to compensate for the p-type tuning of the Al. Alternatively, the gate electrode material itself may be chosen to be an n-type metal, upon which the introduction of small amounts of Al would have little effect.

Figure 4:
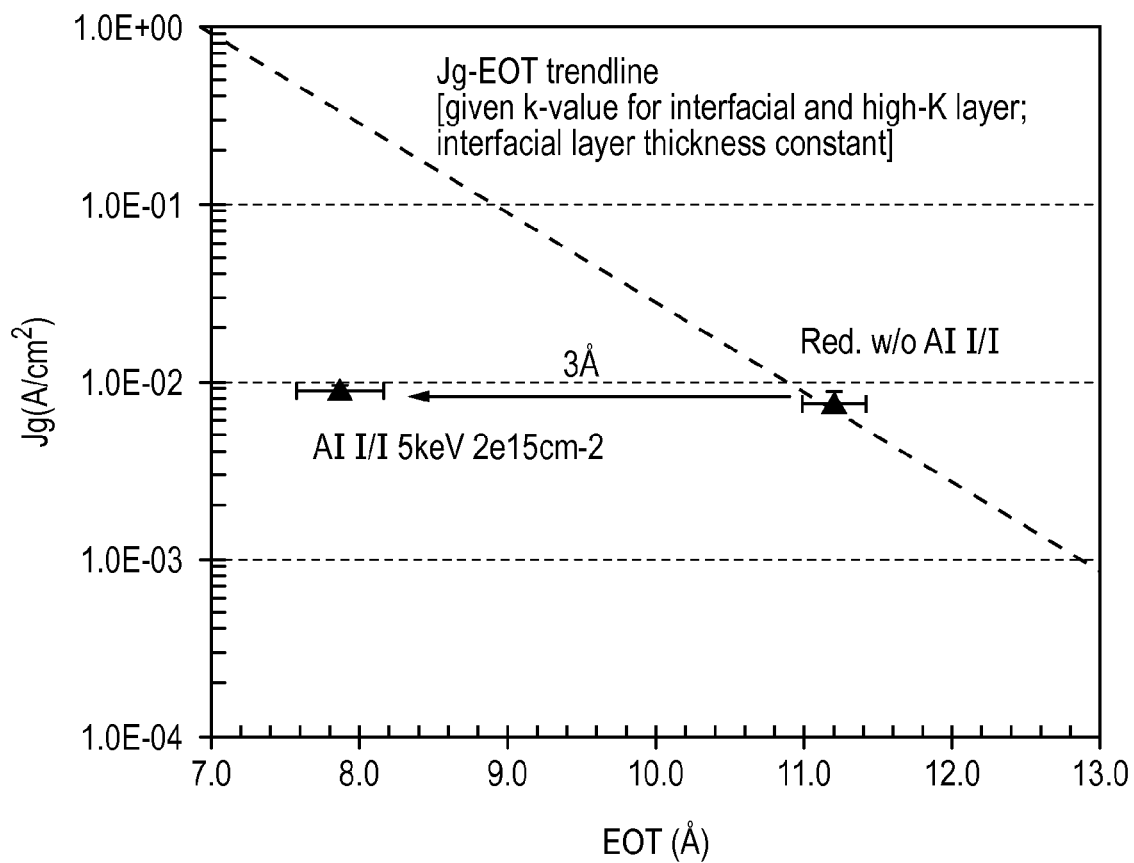
FIG. 4 shows the result of a trial that has been performed to investigate the effect of Al introduction into a high-K gate structure.

FIG. 4 shows the result of a trial that has been performed to investigate the effect of Al introduction into a high-K gate structure using a method of the kind described above in relation to FIG. 5.

The trend line shown in FIG. 4 indicates the gate leakage trade-off for a given interfacial layer (constant thickness and constant κ value) and variably thick high-K layer with given κ value. FIG. 4 also shows a comparison of a sample (with a gate stack comprising: a 10 nm TiN electrode material layer, a 10 nm Si capping layer, a 2 nm $HfO_2$ high-K dielectric layer, and a 7 Å $SiO_2$ interfacial layer) produced using Al implantation as described above (ion implantation energy 5 keV, dosage $2 \times 10^{15}$ $cm^{-2}$, followed by an anneal at 1050° C. for 1 second), with a reference sample for which no Al implantation took place. As can be seen from FIG. 4, a reduction of 3 Å in EOT was achieved, without any increase in gate leakage.

Accordingly, there has been described a field effect transistor having a gate structure that comprises an interfacial layer positioned in between the transistor channel region and a high-K dielectric layer of the gate stack. The interfacial layer comprises $Al_xSi_yO_z$, which has a higher relative dielectric constant value than $SiO_2$. A method of forming the gate structure of a field effect transistor has also been described. The method includes forming a gate stack comprising, in order: a $SiO_2$-based layer adjacent a channel region of the field effect transistor; a high-K dielectric layer on the $SiO_2$-based layer; and a gate electrode on the high-K dielectric layer. The method also includes introducing Al into the $SiO_2$-based layer to form an $Al_xSi_yO_z$ interfacial layer in between the high-K dielectric layer and the channel region. A heating step to allows Al introduced into channel region to diffuse out of the channel region into the interfacial layer.

Although particular embodiments of the invention have been described, it will be appreciated that many modifications/additions and/or substitutions may be made within the scope of the claimed invention.

The invention claimed is:

1. A method of forming a gate structure of a field effect transistor, the method comprising:
    forming a gate stack comprising, in order:
        a $SiO_2$-based layer adjacent a channel region of the field effect transistor;
        a high-K dielectric layer on the $SiO_2$-based layer; and
        a gate electrode on the high-K dielectric layer;
    performing an Al introduction step, whereby Al is introduced into the $SiO_2$-based layer to form an $Al_xSi_yO_z$ interfacial layer in between the high-K dielectric layer and the channel region;
    performing a heating step to allow Al introduced into the channel region during said Al introduction step to diffuse out of the channel region into the interfacial layer; and
    compensating for a p-type tuning effect on the work function of the gate electrode due to the Al introduction step by adding n-type dopants to the gate electrode.

2. The method of claim 1, wherein said Al introduction step comprises ion implantation.

3. The method of claim 2, wherein the ion implantation is performed with an implantation energy in the range 2-8 keV.

4. The method of claim 3, wherein the ion implantation is performed with a dosage level in the range $1\times10^{15}$ cm$^{-2}$ to $6\times10^{15}$ cm$^{-2}$.

5. The method of claim 1, wherein said Al introduction step comprises plasma doping (PLAD).

6. The method of claim 1, comprising forming said gate structure on a MISFET, a FinFET, or a TrenchFET.

7. The method of claim 1, wherein the heating step is performed at a temperature in the range 600° C. to 1100° C. for a duration between 1 s to less than a minute.

8. The method of claim 1, wherein the heating step is performed at a temperature above 1000° C. and up to 1100° C.

9. A method of forming a gate structure of a field effect transistor, the method comprising:
    forming a gate stack comprising, in order:
        a $SiO_2$-based layer adjacent a channel region of the field effect transistor;
        a high-K dielectric layer on the $SiO_2$-based layer; and
        a gate electrode on the high-K dielectric layer;
    performing an Al introduction step, whereby Al is introduced into the $SiO_2$-based layer to form an $AlSi_yO_z$ interfacial layer in between the high-K dielectric layer and the channel region;
    performing a heating step to allow Al introduced into the channel region during said Al introduction step to diffuse out of the channel region into the interfacial layer; and
    adding n-type dopants to the gate electrode;
    wherein the step of adding n-type dopants further includes compensating for a p-type tuning effect on the work function of the gate electrode due to the Al introduction step.

* * * * *